United States Patent [19]
Benz et al.

[11] Patent Number: 5,472,936
[45] Date of Patent: Dec. 5, 1995

[54] METHOD FOR MAKING TRINIOBIUM TIN SEMICONDUCTOR

[75] Inventors: Mark G. Benz, Burnt Hills; Neil A. Johnson, Schenectady; Melissa L. Murray, Schaghticoke; Robert J. Zabala; Louis E. Hibbs, Jr., both of Schenectady; Bruce A. Knudsen, Amsterdam, all of N.Y.

[73] Assignee: General Electric Company, Schenectady, N.Y.

[21] Appl. No.: 270,629

[22] Filed: Jul. 5, 1994

[51] Int. Cl.⁶ .............................. B05D 1/18; B05D 5/12
[52] U.S. Cl. ..................... 148/98; 505/813; 505/821; 505/818; 427/62; 427/432; 427/434.2; 427/436
[58] Field of Search ..................... 505/821, 813, 505/818; 427/62, 432, 434.2, 436

[56] References Cited

U.S. PATENT DOCUMENTS 3,710,844  1/1973  Doi et al. ............................. 427/62
3,838,503  10/1974  Suenaga et al. .......................... 29/599

FOREIGN PATENT DOCUMENTS 1254542  11/1971  United Kingdom.
1342726  1/1974  United Kingdom.

OTHER PUBLICATIONS

Article–Enhancement of the Critical Current Density in Niobium–Tin, J. S. Caslaw–Cryogenics, Feb. 1971–pp. 57–59.

Article–Nb2Sn Diffusion Layers. An Experimental Study of Their Superconducting Properties as Related to the Zr Content and Cold–Work Amount of the Nb Base Ribbons, G Pasotti et al. IL NUOVO CIMENTO, vol. 35B, N. 2–Oct. 11, 1976–pp. 165–178.

*Primary Examiner*—Roy V. King
*Attorney, Agent, or Firm*—Noreen C. Johnson; James Magee, Jr.

[57] ABSTRACT

A method for making triniobium tin foil is disclosed where the niobium-based foil with an oxide layer is passed continuously at a set speed into an enclosed chamber. The enclosed chamber has an inert atmosphere which is substantially oxygen free. Upon entering the chamber, the foil passes through a decomposition anneal furnace, a low temperature tin dip, and then a high temperature reaction anneal furnace before exiting the chamber as triniobium tin foil.

10 Claims, No Drawings

METHOD FOR MAKING TRINIOBIUM TIN SEMICONDUCTOR

FIELD OF THE INVENTION

This invention relates to a method for making triniobium tin superconducting foil. More specifically, this invention relates to a method for making triniobium superconducting foil in an enclosed chamber in a continuous cycle that utilizes a low temperature tin bath and a high temperature reaction anneal.

BACKGROUND OF THE INVENTION

The intermetallic compound triniobium tin, $Nb_3Sn$, is a type-II metallic superconductor of interest because it has high values of superconducting critical current density in high magnetic fields. Historically, $Nb_3Sn$ has been formed using a number of different processes. These include: 1) condensation from the vapor phase; 2) crystallization from the liquid phase; 3) diffusion between one solid phase and one liquid phase; and 4) diffusion between two solid phases.

Methods for forming triniobium tin superconductors by liquid-solid diffusion require multiple steps. The general method is well known and a description of this method is given below.

Generally, the first step in forming triniobium tin superconductor is to clean the niobium or niobium based substrate. This is done with a cleaning solution or etchant, such as a mixture of nitric acid, hydrochloric acid, and water. Diluted hydrofluoric acid is also sometimes used for cleaning the substrate. After the substrate is cleaned, oxygen may be added to the surface of the substrate by anodizing the surface electrolytically.

The next three steps involve high temperature heat treatments. The first anneal, as taught by Caslaw in British patent 1,342,726, is used to introduce a desired oxygen content into the niobium substrate. This is accomplished by passing the substrate through a furnace at about 950° C. for about 30 seconds in an atmosphere containing argon and oxygen. However, if the substrate has been previously anodized to form an oxide layer on the surface of the substrate, then the preheat is called a decomposition anneal whereby the substrate is annealed so that the oxide layer diffuses into the body of the substrate. This would be conducted in an oxygen free environment.

After the preheat, the substrate is dipped in a tin or tin alloy bath, which supplies the tin for the triniobium tin reaction. The operating temperature for the tin bath is between 900°–1000° C.

The tin coating from the bath has a limiting thickness due to the amount of tin needed to further react with the niobium. This thickness is about two to thirty micrometers of tin. The tin thickness is inversely proportional to the viscosity of the tin bath and the temperature of the tin bath, and proportional to the foil speed. Thus, the tin thickness places a lower limit on the substrate speed in the tin dip, which, as an example, is about thirteen centimeters per second for a tin bath at 900°–1000°0 C.

Subsequently, after the tin coating is applied, the niobium substrate is cooled before being treated with a reaction anneal to react the tin coating and the niobium base metal. During this final anneal, a layer of superconducting triniobium tin is formed on both sides of the niobium substrate. In the reaction anneal, the foil is moved through a furnace at about 1050° C. and the speed of the foil depends on the anneal time and the height of the furnace. For instance, in a five meter furnace for about two hundred seconds at 1050° C., the foil speed is about 2.5 centimeters per second.

The above-mentioned steps, the preheat step, the tin dip, and the reaction anneal, are generally performed separately due to space limitations in manufacturing areas and variations in the substrate speed through the different steps.

Thus, there is a need to have an efficient process for making triniobium tin that combines the three high temperature steps into one, continuous cycle within a chamber having uniform atmosphere conditions.

There is also a need to utilize one substrate speed through the different high temperature steps. Further, there is a need for a triniobium tin method that has a low tin bath temperature yielding slow foil speeds and thick tin deposits, while the reaction anneal step operates at a higher temperature with shorter furnace lengths.

SUMMARY OF THE INVENTION

This invention fulfills these needs by providing a method for forming triniobium tin superconductor where said method is performed in an enclosed chamber consisting essentially of an inert atmosphere that is substantially oxygen free, and comprises passing continuously at a uniform speed, a niobium-based foil having a thickness greater than about 0.0005 inches, with about two atomic percent oxygen added to said foil surface from anodization, through a vertical decomposition anneal furnace at a temperature of above about 930° C. for about 10–30 seconds, through a molten tin bath at a temperature between about 300°–800° C. for a time and at a speed sufficient to achieve the desired thickness of tin coating on the substrate, and through a vertical reaction anneal furnace at a temperature greater than about 1100° C.

The niobium-based foil of choice is a niobium-zirconium alloy, specifically a niobium-one atomic percent zirconium alloy foil. Other metals, such as titanium, aluminum, hafnium, and vanadium, may constitute a minor percentage of the niobium-based foil instead of zirconium.

In this invention the starting material, the niobium-based foil, has an oxide layer from anodization. The anodized layer is thick enough to provide about two atomic percent oxygen when the oxygen is dissolved uniformly into the foil in the decomposition anneal furnace.

The enclosed chamber houses the vertical decomposition anneal furnace, the tin bath, and the reaction anneal furnace. The inert atmosphere contained within the chamber and furnaces is selected from the group consisting of argon, helium, and mixtures of argon and helium. A substantially oxygen free atmosphere can have up to twenty parts per million oxygen present without effecting the process. The enclosed chamber is constructed of materials used by those skilled in the art to house high temperature processes. For example, a combination of steel for the enclosed chamber and tin dip encasement can be utilized, and quartz tubes can be used for the furnaces, and aluminum tubing for the cooling system.

Structurally within the chamber, the decomposition anneal furnace and the reaction anneal furnace are parallel to each other and are situated in close proximity directly above the molten tin bath. A foil undergoing the process enters the chamber and travels from the top of the decomposition anneal furnace to the bottom. Upon exiting the furnace, the foil immediately enters the tin bath and passes along a roller or rollers immersed in the bottom of the bath. The coated foil upon leaving the bath, goes directly into the bottom of the reaction anneal furnace and travels upward to the top of the furnace where it exits both the furnace and the chamber.

One benefit of this invention is that an enclosed chamber allows the use of a simplified engineering design for the housing encasement containing the decomposition anneal furnace, tin bath, and reaction anneal furnace. The containment of the process within one chamber provides space-saving options, as well as energy efficiency.

Another benefit of this invention is that the lower tin dip temperature increases the viscosity of the tin bath. This allows a slower foil speed through the bath to achieve the minimum limit imposed on the thickness of the tin layer provided by the tin dip. The increased viscosity of the tin lowers the minimum velocity of the foil. The option to operate the process at lower speeds will reduce the demands on the cooling system.

Still another benefit of the invention is that the lower temperature of the tin dip minimizes and retards the formation of triniobium tin, $Nb_3Sn$, and niobium pentoxide, $Nb_2O_5$, dross. Formation of triniobium tin dross on the tin bath surface is presently a manufacturing problem due to contamination of the tin coating with the dross when the foil is drawn from the bath.

Yet another benefit of the invention is the use of a higher temperature for the reaction anneal to form triniobium tin superconducting foil. A higher temperature decreases the necessary reaction time. Thus, the use of a higher reaction anneal temperature and a lower tin bath temperature can be balanced with furnace lengths to give equal foil speeds through each treatment step in the enclosed chamber.

DESCRIPTION OF THE INVENTION

This invention combines the decomposition anneal, the tin dip, and the reaction anneal into one continuous cycle. The single cycle means that the foil is not cooled to room temperature between each thermal process.

The niobium-based foil preferably contains zirconium in the proportion of about one atomic percent. If desired, the percentage of zirconium may be increased up to about eight atomic percent.

Preferably, the thickness of the niobium-based foil is between about 0.0008–0.0012 inches. However, the foil thickness may be from greater than about 0.0005 to about 0.008 inches.

Before the foil enters the enclosed chamber to undergo the various steps of this invention, the niobium-based foil has an oxygen layer placed on its surface. This can be accomplished by anodizing the foil using methods known to those skilled in the art. The oxide layer from anodizing the foil is thick enough to provide about two atomic percent oxygen when the oxygen is subsequently dissolved uniformly into the foil during the decomposition anneal. Also, the oxide film formed during the anodization process is amorphous.

In the practice of this invention rolled foil with an oxide coating enters the top of the enclosed chamber and immediately passes into the top of the vertical decomposition anneal furnace. The foil travels continuously down the furnace at a set speed. The speed is determined by the temperature of the tin bath, its viscosity, and the desired thickness of the tin coating. The decomposition anneal furnace can be designed by means known to those skilled in the art, such as resistive or inductive furnaces.

The temperature inside the furnace is above about 930° C. and the atmosphere is inert and substantially oxygen free. The foil is annealed for about 10–30 seconds. During the anneal, it is energetically favorable for the surface oxide to dissociate according to the reaction:

$$Nb_2O_5 = 2Nb + 5"O"$$

Here, "O" represents dissolved oxygen in the niobium-based foil.

The decomposition anneal serves to drive the surface oxygen into the foil and insures wetting of the foil by the subsequent tin coating. The temperature of the decomposition anneal is determined by the temperature at which the oxygen dissolves into the niobium foil. This temperature can be obtained from a binary phase diagram for niobium and oxygen. To demonstrate this, for anodized foil containing two atomic percent oxygen, the niobium oxide dissolves at temperatures above about 930° C. This means that, for the tin to wet to the foil, a foil decomposition anneal at a temperature greater than about 930° C. is necessary.

In the practice of this invention the foil surface will not re-oxidize after the decomposition anneal if it is exposed for a short time in a low-oxygen environment prior to the tin dip. A low-oxygen environment means that up to twenty parts per million oxygen can be present in the atmosphere. A short time is about one minute or less.

After the foil exits the bottom of the decomposition anneal furnace, the foil enters into the molten tin bath. The bath is placed immediately below the vertical decomposition anneal furnace and vertical reaction anneal furnace inside the enclosed chamber. The composition of the tin bath is selected from the group consisting essentially of tin and tin-copper alloys wherein there is up to about twenty atomic percent copper.

The temperature of the tin bath is between 300°–800° C. The temperature is chosen based on whether other alloy metals, such as copper, are present in the tin bath. For instance, if zero copper is present, then lower temperatures, around 300° C. may be utilized. When seventeen to twenty atomic percent copper is present, the bath temperature can be above 500° C. One skilled in the art will be able to use a phase diagram for tin and alloying metals in the bath to aid in the selection of the bath temperature.

The time that the foil is in the tin bath is controlled by the speed that it travels through the bath. At lower temperatures, slower speeds can be used and thicker tin deposits are obtained. The tin coating should be thick enough to form triniobium tin during the subsequent reaction anneal. Thus, the desired thickness of the tin coat governs the speed that the foil travels through the tin bath, the decomposition anneal furnace and the reaction anneal furnace.

Further, operating the tin bath at low temperatures reduces significantly the rate of formation of triniobium tin dross. The reduction of dross formation in the tin bath and the use of low temperature tin baths for making triniobium tin superconductor is the subject of a copending and commonly assigned application, entitled "Low Temperature Tin Bath for Superconducting $Nb_3Sn$ Foil".

When the tin or tin-copper alloy foil leaves the tin bath, the surface of the foil has between about 2–30 micrometers of tin or tin alloy per side of foil. The coated foil then passes directly into the vertical reaction anneal furnace from the bottom and travels upward. The time that the foil passes through the reaction anneal furnace depends on the foil speed and the length of the furnace.

The coated foil is annealed at temperatures above about 1100° C. in an inert atmosphere within the reaction anneal furnace. During the anneal, the tin reacts with niobium at the niobium-tin interface to form triniobium tin. In this process, the tin or tin alloy is liquid and flows down the surface of the foil in the furnace. Thus, the length of the furnace is shortened and the reaction temperature is raised above 1100° C. so that the reaction time to form triniobium tin is shortened.

After exiting from the top of the reaction anneal furnace and the top of the enclosed chamber, the superconducting triniobium tin foil is wound on to a spool.

The invention is further demonstrated by the following examples and test results obtained from process runs and tabulated in Table I. The tin bath ranged from 660°–800° C. and the reaction anneal and preheat were performed at 1200° C. The tin bath composition was seventeen atomic percent copper and the balance tin. The length of the hot zone in the decomposition and reaction anneal furnaces was about fifteen inches. The test run results in Table I demonstrate that combining the decomposition anneal, tin dip, and reaction anneal into one continuous cycle, using a set foil speed, produce superconducting triniobium tin foil.

TABLE I

RESULTS FROM SINGLE CYCLE DECOMPOSITION ANNEAL-TIN DIP-REACTION ANNEAL PROCESS RUNS

| Example | Foil Speed (ft/min) | Decomp./ Reaction Anneal (°C.) | Tin Bath Temp. (°C.) | $Nb_3Sn$ thickness (um) | $J_c$ 5T,4.2K ($\times 10^5 A/cm^2$) |
|---|---|---|---|---|---|
| 1 | 2 | 1200 | 660 | 2.1 | 5.2 |
| 2 | 1.5 | 1200 | 700 | 5.3 | 5.9 |
| 3 | 1.5 | 1200 | 800 | 5.9 | 4.1 |

What is claimed:

1. A method for forming triniobium tin superconductor where said method is performed in an enclosed chamber consisting essentially of an inert atmosphere that is substantially oxygen free, and comprises the step of:

passing continuously at a uniform speed, a niobium-based foil having a thickness greater than about 0.0005 inches, with an oxide layer on said foil, through a vertical decomposition anneal furnace, starting at the top of the decomposition anneal furnace and traveling downward, at a temperature of above about 930° C. for about 10–30 seconds, then through a molten tin bath at a temperature between about 300°–800° C. for a time and at a speed sufficient to achieve a desired thickness of a tin coating on the foil, and then through a vertical reaction anneal furnace, starting from the bottom of the reaction anneal furnace and traveling upward, at a temperature greater than 1100° C., thereby forming a triniobium tin superconductor foil.

2. A method according to claim 1 where the niobium-based foil is a foil consisting essentially of niobium and one atomic percent zirconium.

3. A method according to claim 1 where the oxide layer on said foil is thick enough to provide about two atomic percent oxygen when the oxygen is dissolved uniformly into the foil in the decomposition anneal furnace.

4. A method according to claim 1 wherein the substantially oxygen free atmosphere consists essentially of an inert gas and up to twenty parts per million oxygen in the atmosphere.

5. A method according to claim 1 where the inert gas is selected from the group consisting of argon, helium, and a mixture of argon and helium.

6. A method according to claim 1 where the tin bath consists essentially of tin and up to about twenty atomic percent copper.

7. A method according to claim 6 where the tin bath consists essentially of tin and about seventeen atomic percent copper.

8. A method according to claim 1 where the thickness of the niobium-based foil is between about 0.0008–0.0012 inches.

9. A method according to claim 1 where the thickness of the tin coating on the foil is between about 2–30 micrometers per side of the foil.

10. A method for forming a triniobium tin superconductor foil in an enclosed chamber consisting essentially of argon and up to twenty parts per million oxygen in the atmosphere, said method comprising;

passing continuously at a constant speed, a niobium-one atomic percent zirconium-two atomic percent oxygen foil that is about 0.001 inch thick, through a vertical decomposition anneal furnace, starting at the top of the decomposition anneal furnace and exiting at the bottom of the decomposition anneal furnace, at a temperature above about 930° C. for about 10–30 seconds, then through a molten tin bath consisting essentially of tin and seventeen atomic percent copper, at a temperature between about 700°–800° C. for a time and at a speed sufficient to achieve between about 2–30 micrometers of a tin coating on each side of the foil, and then through a vertical reaction anneal furnace, starting from the bottom of the reaction anneal furnace and exiting at the top of the reaction anneal furnace, at a temperature greater than 1100° C., thereby the triniobium tin superconductor foil.

\* \* \* \* \*